United States Patent
Alrod et al.

(10) Patent No.: US 10,871,910 B1
(45) Date of Patent: Dec. 22, 2020

(54) NON-VOLATILE MEMORY WITH SELECTIVE INTERLEAVED CODING BASED ON BLOCK RELIABILITY

(71) Applicant: Western Digital Technologies, Inc., San Jose, CA (US)

(72) Inventors: Idan Alrod, Herzeliya (IL); Ariel Navon, Revava (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/586,895

(22) Filed: Sep. 27, 2019

(51) Int. Cl.
| | |
|---|---|
| *G06F 11/00* | (2006.01) |
| *G06F 3/06* | (2006.01) |
| *G11C 29/52* | (2006.01) |
| *G06F 11/10* | (2006.01) |
| *G06F 11/07* | (2006.01) |
| *G06F 12/06* | (2006.01) |

(52) U.S. Cl.
CPC ............ *G06F 3/064* (2013.01); *G06F 3/0619* (2013.01); *G06F 3/0644* (2013.01); *G06F 3/0653* (2013.01); *G06F 3/0679* (2013.01); *G06F 11/076* (2013.01); *G06F 11/1044* (2013.01); *G06F 11/1068* (2013.01); *G06F 12/0607* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 6,334,024 B1* | 12/2001 | Ohishi | ............... | G11B 20/1809 |
| | | | | 386/246 |
| 2005/0193233 A1* | 9/2005 | Magliocco | ....... | G11C 29/56004 |
| | | | | 714/5.1 |
| 2007/0180186 A1* | 8/2007 | Cornwell | .............. | G06F 12/023 |
| | | | | 711/103 |
| 2008/0320214 A1* | 12/2008 | Ma | ....................... | G06F 12/0246 |
| | | | | 711/103 |
| 2010/0088575 A1* | 4/2010 | Sharon | .............. | H03M 13/6591 |
| | | | | 714/763 |
| 2016/0006462 A1* | 1/2016 | Hanham | ........... | H03M 13/3715 |
| | | | | 714/764 |
| 2019/0355435 A1* | 11/2019 | Liikanen | ................ | G11C 29/42 |
| 2020/0073573 A1* | 3/2020 | Park | ........................ | G06F 3/061 |

* cited by examiner

*Primary Examiner* — Mujtaba M Chaudry
(74) *Attorney, Agent, or Firm* — Vierra Magen Marcus LLP

(57) ABSTRACT

In one embodiment, the disclosure teaches an apparatus including a memory array and a processor in communication with the memory array. The processor is configured to determine health scores of blocks of the memory array, where the health scores indicate the health of the blocks. The processor also is configured to receive data from a host, and select an interleaving scheme for programming the data based on the data type and a block to which the data is written based on the health scores. In one embodiment, sequential type data is written to unhealthy blocks and non-sequential data is written to healthy blocks.

21 Claims, 4 Drawing Sheets

NON-VOLATILE MEMORY WITH SELECTIVE INTERLEAVED CODING BASED ON BLOCK RELIABILITY

BACKGROUND

The present disclosure relates to non-volatile memory and more particularly methods of writing data to different memory blocks.

Non-volatile memory (NVM) systems, such as flash memory, have been widely adopted for use in consumer products. Flash memory systems typically are segregated into partitions such as blocks and pages, which allows the memory to be used more efficiently, where a block is a unit for an erase operation and a page is a unit for read and write operations. Flash memory also can have single level cells (SLC) that store a single bit and multi-level cells (MLC) that store more than one bit. In order to ensure that data written to memory may be correctly read from the memory, the data is written using Error Correction Coding (ECC) and/or parity bits, which are essential components of any storage system. Thus, data to be written to the memory is encoded using an ECC scheme and the encoded data and parity bits are written to the memory. The encoded data is stored in the memory in either an interleaved or a non-interleaved manner. In non-interleaved coding, each codeword (data subjected to ECC) is stored on a different logical page, whereas in interleaved coding, each codeword spans all of the pages of a Wordline (WL).

Unfortunately, NVM memory systems, such as NAND memories, suffer from bad cells and bad blocks. As is well known, in NAND memories, blocks wear out and over time become unreliable. It is advantageous to be able to use memory cells as long as possible.

SUMMARY

An illustrative embodiment disclosed herein is an apparatus, including a memory array and a processor in communication with the memory array. The processor is configured to determine health scores for a plurality of blocks of the memory array. The health scores indicate the health of the blocks. The processor is configured to receive, from a host, data having a data type and select an interleaving scheme for encoding the data based on the data type. The interleaving scheme is one of interleaved and non-interleaved. The processor is configured to write the data to a healthy block if a non-interleaved scheme was selected and write the data to an unhealthy block if an interleaved scheme was selected.

Another illustrative embodiment disclosed herein is a method including determining, by a controller, health scores for a plurality of blocks of a memory array. The health scores indicate the health of the blocks. The method includes receiving, by the controller and from a host, data having a data type and selecting, by the controller, an interleaving scheme for encoding the data based on the data type. The interleaving scheme is one of interleaved and non-interleaved. The method includes writing, by the controller, the data to a healthy block if a non-interleaved scheme was selected and writing the data to an unhealthy block if an interleaved scheme was selected.

Another illustrative embodiment disclosed herein is a an apparatus, including a memory array and processing means in communication with the memory array. The processing means includes means for determining health scores for a plurality of blocks of the memory array. The health scores indicate the health of the blocks. The processing means includes means for receiving, from a host, data having a data type and means for selecting an interleaving scheme for encoding the data based on the data type. The interleaving scheme is one of interleaved and non-interleaved. The processing means includes means for writing the data to a healthy block if a non-interleaved scheme was selected and means for writing the data to an unhealthy block if an interleaved scheme was selected.

DETAILED DESCRIPTION

Figure 1:
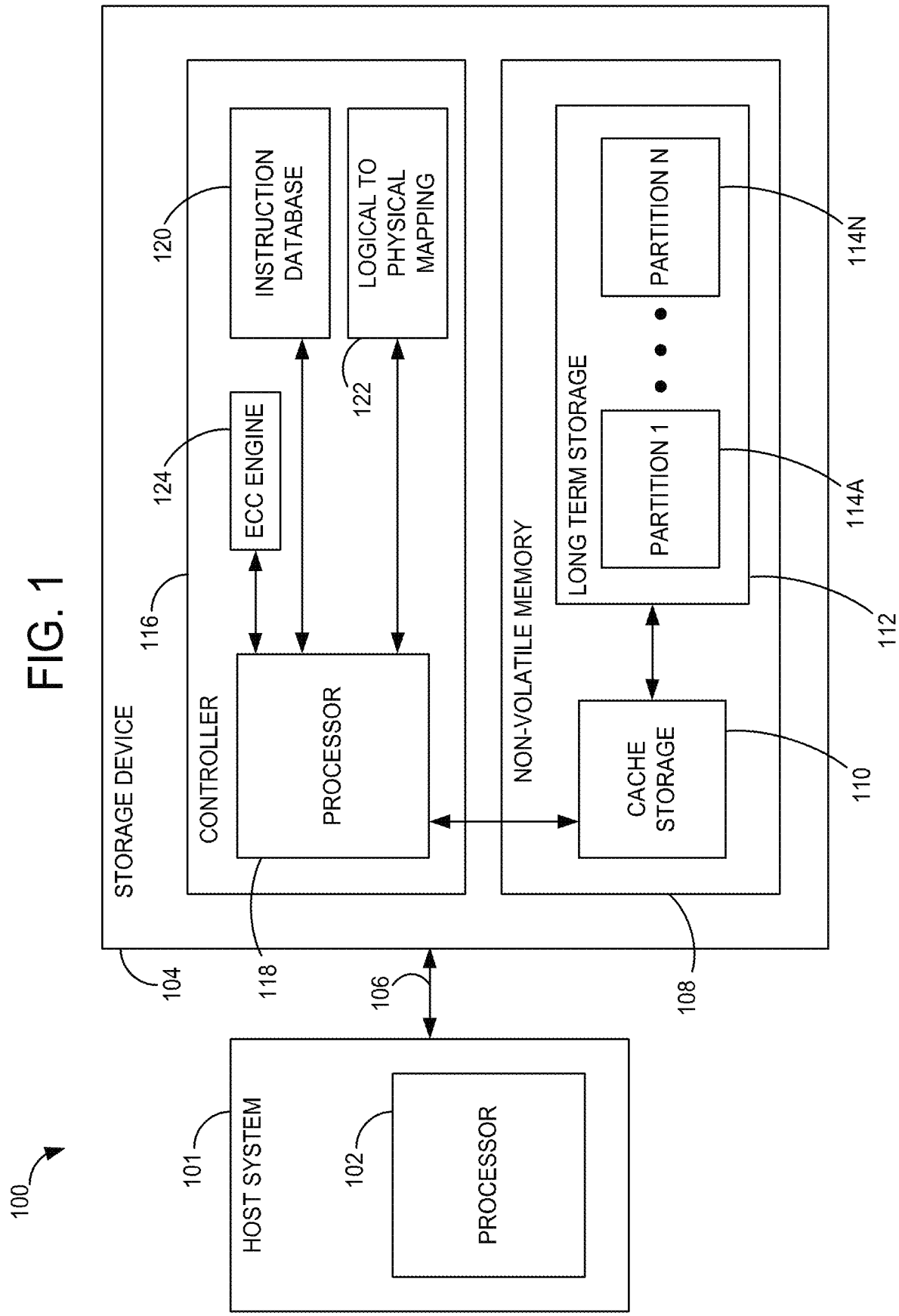
FIG. 1 is a schematic block diagram of a memory system, in accordance with some embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present invention, as generally described herein, and illustrated in the figures, can be arranged, substituted, combined, and designed in a wide variety of different configurations, all of which are explicitly contemplated and make part of this disclosure.

Error-Correction-Coding (ECC) is a component of any storage system. Encoding includes arranging data in code words and protecting the data with redundant parity data. The encoded data is placed in the memory in either an interleaved manner or a non-interleaved manner. In interleaved coding, each code word spans multiple logical pages of a word line (WL). Interleaved coding allows for bit error rate (BER) averaging within a code word. However, interleaved coding requires sensing all logical pages in order to decode a single code word.

Random data (e.g., pushed data, temporary data, operating system data and random access data) may be i) distributed across a random set of addresses, ii) read frequently, iii) read in only a small sector of a corresponding file, or iv) intended for a short period of time. Shorter codes with less redundancy, higher data rate, higher error floor, and faster read/write times may be desirable for storage of this type of data. In contrast, sequential data (e.g., digital photos, music, user files, etc.) is stored sequentially, and is read and written in sequential order. It may be desirable to store these file types with longer error correction code protection at the expense of a lower data rate or higher read/write latency.

Conventional flash memory systems support only one storage format. Single format storage results in either random data having undesired latency or sequential data having weaker than desired error code protection. Furthermore, in conventional systems, all storage formats are indiscriminately written to memory blocks of varying health and reliability, resulting in the blocks having less than desired memory endurance. Because of the differing needs of the different types of data for speed of access and ECC protection, a technical problem exists wherein a flash memory system that supports at least two storage formats simultaneously, other than in the SLC (Single Level Cell) cache, and a method for operating such a system is needed.

Some embodiments of the present disclosure present a technical solution to the technical problem: a system and method for mapping memory blocks according to the health of the blocks. Some embodiments of the present disclosure apply a combination of interleaved and non-interleaved coding schemes in the same memory device, direct the interleaved data to less reliable blocks, and direct the non-interleaved data to more reliable blocks.

As is understood by those of skill in the art, the physical health of a memory block changes over the life of the memory based on usage. Some embodiments of the disclosure re-check the health of the memory blocks and re-map the interleaved/non-interleaved blocks according to the updated health. Some embodiments re-map data from one coding scheme to another based on the portion of available degraded physical blocks. Some embodiments estimate, by applying machine learning or other algorithms, the expected read mode during the programming of the data.

Some embodiments of the present disclosure achieve better wear leveling of the physical blocks, thereby providing an enhanced longevity of the memory, thus increasing the Tera-Bytes-Written metric of a given memory. Further, some embodiments provide stronger error correcting capability for sequential data while simultaneously providing a higher data rate and lower latency for random data. Some embodiments of the system offer a unified ECC protection scheme for storing the various data types while still exploiting the advantages of each data type.

Referring now to FIG. 1, a memory system 100 suitable for use in implementing aspects of the invention is shown. The memory system 100 preferably is a non-volatile memory system, such as a Flash memory system. A host or host system 101 having a processor 102 is in communication with a storage device 104 for writing data to and reading data from the storage device 104. The storage device 104 may comprise a self-caching flash storage device or a solid state disk (SSD) embedded in the host 101, a flash memory in a mobile phone or may exist in the form of a card or other removable drive that is removably connected to the host 101 through a mechanical and electrical connector. The host 101 may be any of a number of data generating devices, such as a personal computer, portable tablet, computing device, mobile phone, etc. The host 101 communicates with the storage device 104 over a communication channel 106.

The storage device 104 contains a non-volatile memory (NVM) 108 that includes cells that are used as a short-term storage (i.e., a cache) 110 and cells that are used for long-term storage 112. The cache 110 and long-term storage 112 may be made up of the same type of flash memory cells or different types of flash memory cells. For example, the cache 110 may be configured in a single level cell (SLC) type of flash configuration having a one bit per cell capacity while the long-term storage 112 may be a multi-level cell (MLC) type flash memory configuration having two or more bit per cell capacity. Typically, SLC flash has a higher write speed than MLC flash, while MLC flash has higher density. Different combinations of flash memory types are also contemplated for the NVM 108. In embodiments described herein, the long-term storage 112 includes at least two partitions 114, where each partition caters to a different class of data as discussed in greater detail below. The storage device 104 also includes a controller 116 that may include a processor 118, a memory such as a Read Only Memory (ROM) for storing an instruction database 120 for operating the processor 118 and a logical block to physical block address translation table 122.

The partitions 114, shown as a plurality of partitions (i.e., partitions 114A-N, collectively referred to as partitions 114) may be physical or logical partitions in the long-term storage 112. The partitions 114 may each comprise one or more planes of the long-term storage 112. In large memory systems having multiple memory dies that make up the long-term storage 112, the partitions may be associated with different physical die. In yet other implementations, the partitions 114 may be separate planes of a single die or even separate portions of the same plane. In one embodiment, files or other data requiring random access are written to a partition configured as a random access partition, while data not requiring random access (such as sequential data) is written to a different partition in the long term storage 112. In some examples, more than two partitions, each used for a different type or types of data, may be implemented.

Figure 2A:
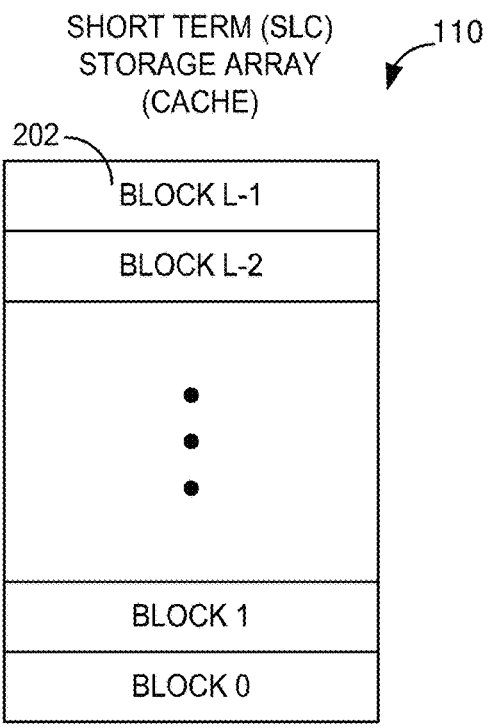
FIG. 2A illustrates a short-term memory of FIG. 1, in accordance with some embodiments of the present disclosure.
Figure 2B:
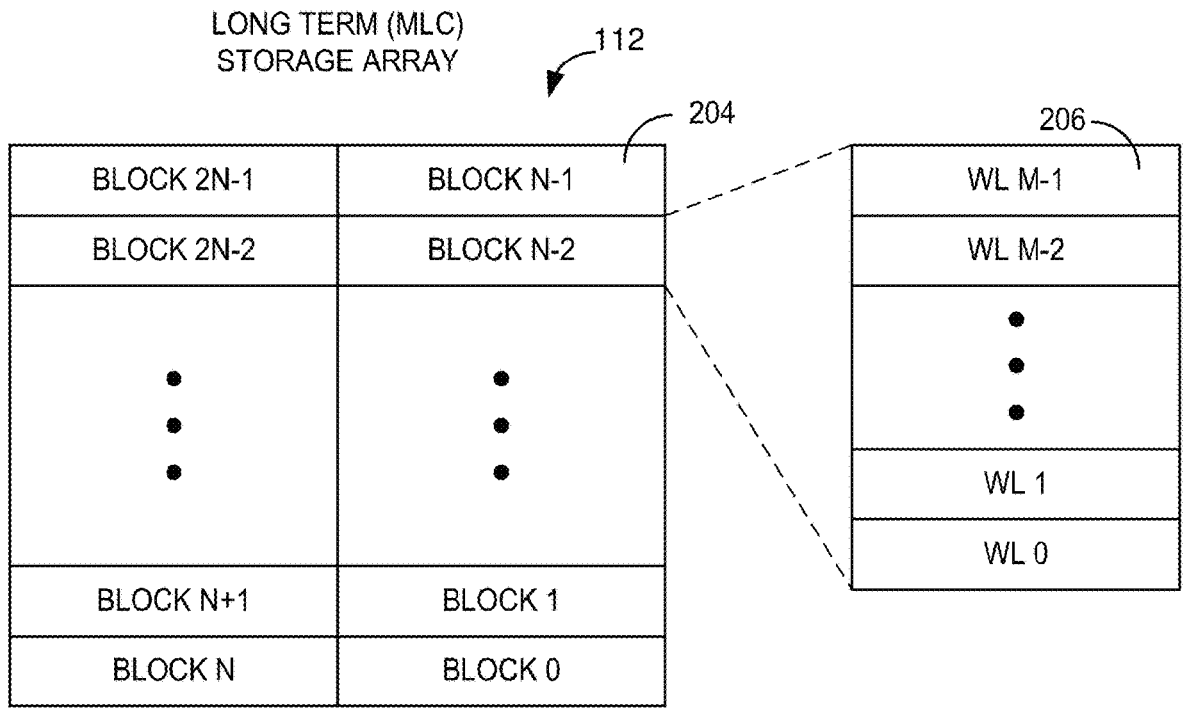
FIG. 2B illustrates a long-term memory of FIG. 1, in accordance with some embodiments of the present disclosure.

Referring to FIG. 2A, the cache 110 of FIG. 1 is shown, in accordance with some embodiments of the present disclosure. The cache 110 includes an array of SLC blocks 202 (e.g., "L" blocks, where L is a positive integer), in some embodiments. Each cell in the SLC blocks 202 includes one bit. Referring to FIG. 2B, the long-term storage 112 of FIG. 1 is shown, in accordance with some embodiments of the present disclosure. The long-term storage 112 includes an array of (e.g., N) MLC blocks 204. The number of bits in each cell in the MLC blocks 204 is greater than one.

A block of memory cells is the unit of erase, e.g., the smallest number of memory cells that are physically erasable together. Each block (e.g., SLC or MLC) comprises a Word Line (WL) 206, and a group of cells belonging to the WL 206 is denoted as a physical page. The number of logical cells of each WL 206 corresponds to the number of bits stored in each cell. The number of logical pages associated with one physical page is equal to the number of bits stored in each cell. Thus, WLs 206 include or correspond to multiple logical pages, where each logical page contains the bits in a certain position. For example, in 3-bits per cell MLC flash, there will be 3 logical pages: one for the least significant bit (LSB), one for the most significant bit (MSB) and a third for the middle bit, which are sometimes referred to as upper, middle and lower pages.

The individual blocks are divided for operational purposes into pages of memory cells. There may be 8, 16, 32 or more pages of memory cells within each block. A page is a unit of data reading and writing within a block, where each page contains an amount of data that may be programmed or read at one time. In some embodiments, the blocks 202 and 204 shown in FIGS. 2A-2B are referred to herein as physical blocks and relate to groups of physical memory cells. As used herein, a logical block is a virtual unit of address space. Each logical block typically has a logical block address (LBA) that is associated with data, such as data received from the host 101. The LBAs are then mapped to one or more physical blocks in the storage device 104 where the data is physically stored. Further details regarding the flash memory system 100 illustrated in FIG. 1 are described in U.S. Pat. No. 8,910,017, which is hereby incorporated by reference in its entirety.

In some embodiments, the controller 116 classifies blocks (e.g., the SLC blocks 202, the MLC blocks 204, a logical representation of the SLC or MLC blocks, or a combination thereof) according to their health (e.g., reliability). In some embodiments, the controller 116 calculates or otherwise determines a health score for each block. In some embodiments, the controller 116 assigns each block to one of two or more partitions based on whether a health score (e.g., metadata) of the block satisfies (e.g., being greater than) a predetermined threshold. For example, the controller 116 assigns a first block to a first partition responsive to the first block's health score satisfying a first predetermined threshold and assigns the first block to a second partition responsive to the first block's health score satisfying a second predetermined threshold. In some embodiments, the health score is based on the number of program/erase (P/E) cycles, a fail bit count (FBC), a bit error rate (BER), a block error rate (BLER), any metric indicating the health of a block, a combination (e.g., ratio, proportion, or other function) of the PE, the FBC, the BER, the BLER, or the any health metric, and a predefined number (e.g., average FBC, BER, or BLER of all the blocks of either the cache 110, long term storage 112, a partition 114, or a storage device 104), or the like.

In some embodiments, the controller 116 accesses a data structure (e.g., a health mapper) mapping health scores (e.g., or health score ranges) to partition identifiers (IDs) corresponding to partitions 114A-N. In some embodiments, the controller 116 classifies, tags, assigns, or otherwise associates a block to a first partition 114A responsive to determining that the health score of the block maps to the partition ID corresponding to the first partition 114A. In some embodiments, the health mapper maps health scores/ranges to data types (e.g., random data, sequential data, or sub-types of random or sequential data). In some embodiments, the data structure is a table, an index array, associative array, or multi-dimensional array. In some embodiments, the indices of the data structure are the health score (e.g., or an index or a hash of the health score) and the values are the partition IDs or the data types. In some embodiments, the health score and the health mapper stored in the cache 110 (e.g., in a management block within the cache 110).

In some embodiments, the controller 116 receives data from the host system 101. In some embodiments, the controller 116 determines a data type of the data received from the host system 101. For example, the data received from the host system 101 may be marked with information that the controller 116 can use to determine if the data is random access data or sequential data (or a specific type of random or sequential data). For example, the controller 116 can read, extract, decode, or otherwise determine a data type from bits in the parity portion of the data. Additionally, or alternatively, the controller 116 may deduce the category (e.g., random access or sequential) of data from past pattern of usage information, such as the file the data is associated with, the frequency of usage, the reading method (random or sequential), and the like. In some embodiments, the controller 116 determines a data type for each block, WL, stringline (SL), or other unit of data. In some embodiments, the first few or last few SLs or WLs in a block are less reliable than the rest of the SLs or WLs in the block (e.g., in a 3D NAND memory array).

The criteria for determining a data type (e.g., whether the data is random data or sequential data) may include the type of the file (e.g., according to the file name suffix), the folder in which the file resides (e.g., a temporary folder, or an operating system folder), or the addressing method used for writing the file. Criteria related to file location and addressing may be derived as a request from the host system 101. In some embodiments, the controller 116 determines a desired partition 114 using enhanced file-tagging information from the host 101. For example, the host 101 can mark certain data transactions to direct data to a memory region or indicate a priority level for the data.

In some embodiments, the controller 116 may determine a data type of a file according to the history of writes and reads of the file, or by the code rate (the ratio between information data to code word length) associated with the file. For example, if data associated with a certain file is encoded with a high code rate (e.g., greater than 0.95) the high code rate may indicate that the file should be stored in the random partition because only a small number of redundant bits are added to the information bits. On the other hand, if the code rate associated with a file is 0.5 (e.g., one parity bit was added for each information bit), this code rate may indicate that the file should be stored in the sequential partition. Similarly, if a file is read with a high frequency, (e.g., once every several minutes), the high frequency may indicate that the file should be stored in a different partition than a file that is rarely read, (e.g., once a month).

In some embodiments, the controller 116 can determine a data type by applying machine learning models or algorithms. In these embodiments, the controller 116 includes a training phase and a performance phase. In the training phase, the controller determines weights by applying training inputs to calculate an output and adjusting or tuning the weights until a combination (e.g., ratio, proportion, or other function) of the calculated output and a predetermined output satisfies a predetermined threshold. In the performance phase, the controller 116 applies data attributes, statistics, history of reads and writes, or other information of the data at the input, and calculates the output using the trained weights. The machine learning models can include artificial neural networks, support vector machines, a regression model, a Bayes model, and the like.

Once the data type is determined, in some embodiments, the controller 116 determines that the data type of the data maps to the partition ID corresponding to the block. In some embodiments, the controller 116 accesses a data structure (e.g., a data type mapper) mapping the data type to a partition ID. In some embodiments, the data type mapper is similar in structure to the health mapper. In some embodiments, the data type mapper and the health mapper are combined into one data structure.

Upon mapping the data type to the partition ID, in some embodiments, the controller 116 selects a first block to program or otherwise direct the data to. In some embodiments, the controller 116 accesses the health mapper mapping the partition ID to one or more blocks including the first block. In some embodiments, the controller 116 applies one or more block selection rules to determine which of the blocks mapping to the partition ID to select. For example, the one or more rules may include selecting an available block with the highest health score, a longest available block, an available block with a lowest or highest block ID, or a randomly or pseudo-randomly selected available block. The available block can include at least one of empty blocks, blocks having data that is scheduled to be erased or overwritten, and blocks having data that is not up-to-date. In some embodiments, if the controller 116 determines that no blocks are available, the controller 116 selects a block not satisfying criteria for being an available block. In some embodiments, responsive to the controller 116 determining that no blocks corresponding to the partition ID are available, the controller 116 selects a block corresponding to a different partition ID. In some embodiments, the controller 116 changes the interleaving scheme applied to the data based on the different partition ID. In some embodiments, the controller 116 programs the data to the selected block (e.g., the first block).

In some embodiments, the controller 116 updates the health score for each block, an algorithm for determining the health score, and/or the health mapper data structure. The algorithm for determining the health score and/or the mapping of the health mapper may be changed by user and/or policy. The update may be based on a schedule or a triggering event. The schedule can be periodic (e.g., once per hour). The triggering event may be a change in the algorithm, a detection of an error rate or a program/erase cycle above a predetermined threshold in one or more partitions, garbage collection, wear leveling, or other memory management operations. The update may be for all the blocks or for blocks to which the triggering event applies (e.g., if a block reaches a predetermined number of errors or program/erase cycles, only the health score of that block is updated).

In some embodiments, upon the health score or the health mapper being updated, the controller 116 can identify non-compliant data (e.g., data that is programmed to a block that is different a block that the data type of the data maps to, using the updated health score and health mapper). The controller 116 can re-program the non-compliant data to new blocks using the updated health score and health mapper. In some embodiments, the controller 116 determines a data type of the non-compliant data and/or health of a block that the non-compliant data is programmed to. In some embodiments, responsive to the non-compliant data being a first data type (e.g., random data) and the health of a block satisfying a threshold (e.g., having a health score that is lower than the health score range mapping to sequential data), the controller 116 re-programs the data to new block using the updated health score and health mapper. In some embodiments, responsive to the non-compliant data being a second data type or the health of the block does not satisfy the threshold, the controller 116 leaves the non-compliant data in the old block.

Figure 3:
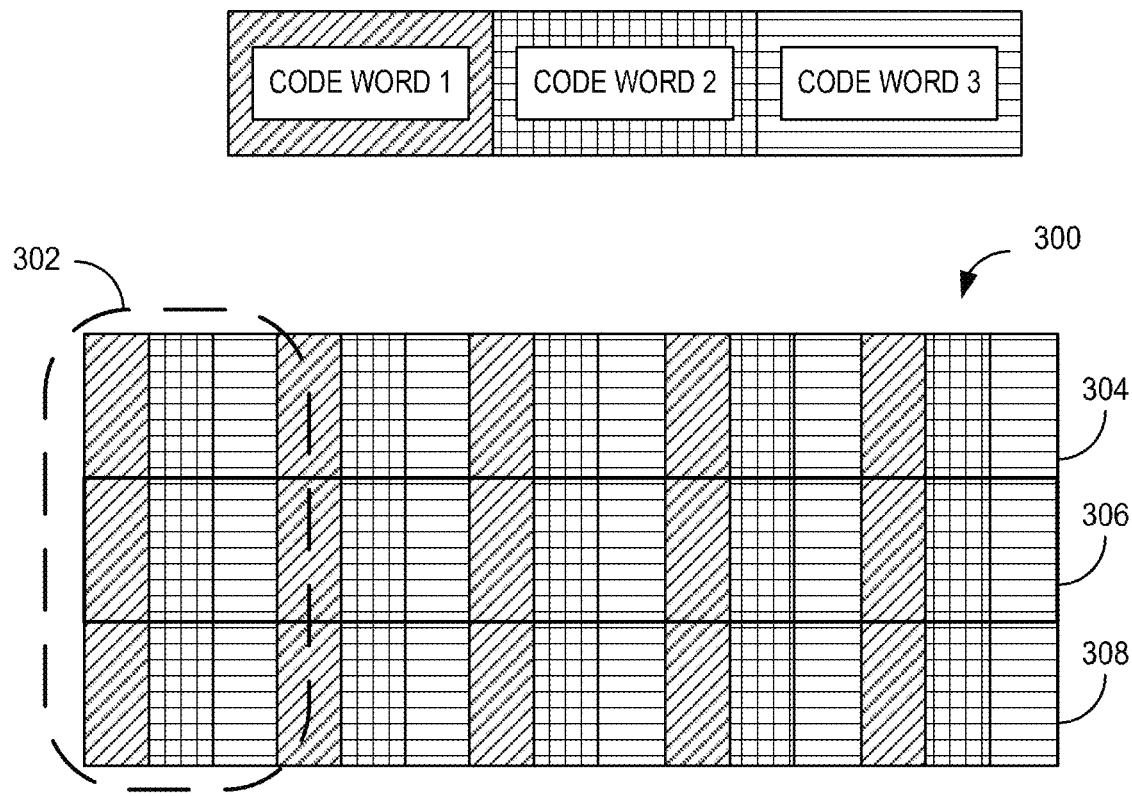
FIG. 3 illustrates a word line with code words programmed in an interleaved manner, in accordance with some embodiments of the present disclosure.

In some embodiments, upon assigning data to a block, the controller 116 selects an interleaving scheme for storing the data to the block. An error correction coding (ECC) code word that is spread along multiple pages is called an interleaved code word, while code words that are stored in one logical page are called non-interleaved. An example of an interleaved ECC scheme in a WL 300 of a 3 bit-per-cell MLC memory is shown in FIG. 3, where each code word (e.g., code word 1, code word 2, and code word 3) is interleaved among all the different pages (upper 304, middle 306 and lower 308) of the WL 300. In FIG. 3, there are 3 pages delineated by different types of cross-hatching. Typically, in the interleaved ECC scheme, each cell of the WL 300 includes information related to one sub-code word 302. The entire code word has N sub-code words, each sub-code word including a data portion and a parity portion, where each sub-code word may include thousands of bits such that each sub-code word will be stored in as many 3 bit-per-cell MLC memory cells as is necessary to accommodate the number of bits in the sub-code word. A code word and/or a sub-code word can be referred to herein as data.

Figure 4:
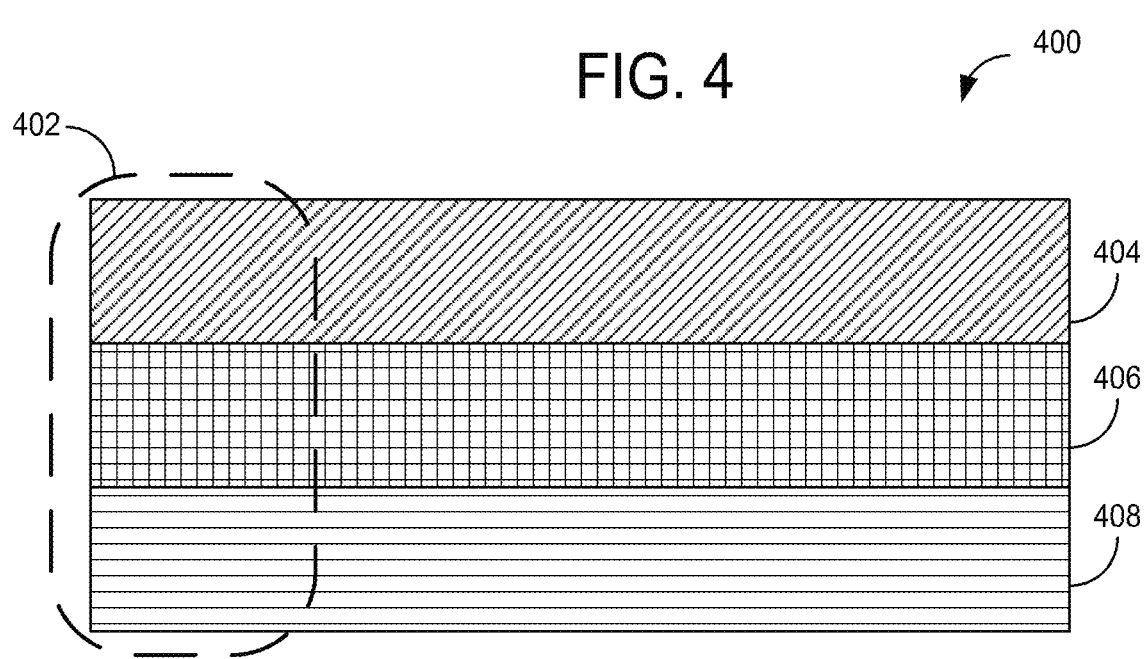
FIG. 4 illustrates a word line with code words programmed in an interleaved manner, in accordance with some embodiments of the present disclosure.

In many flash memory implementations, the error correction coding (ECC) code words are programmed and read per logical page (e.g., each code word is written in a unique logical page). An example of a non-interleaved ECC scheme is shown in FIG. 4 for a WL 400, where each code word is only spread across one page (upper 404, middle 406 or lower 408) of each cell of the WL 400. In the non-interleaved example of FIG. 4, each of the 3 bit-per-cell MLC memory cells includes parts of three different code words, such that item 402 represents 3 sub-code words. In some instances, the WLs 300 and 400 are instances of the WL 206 shown in FIG. 2B.

Figure 5:
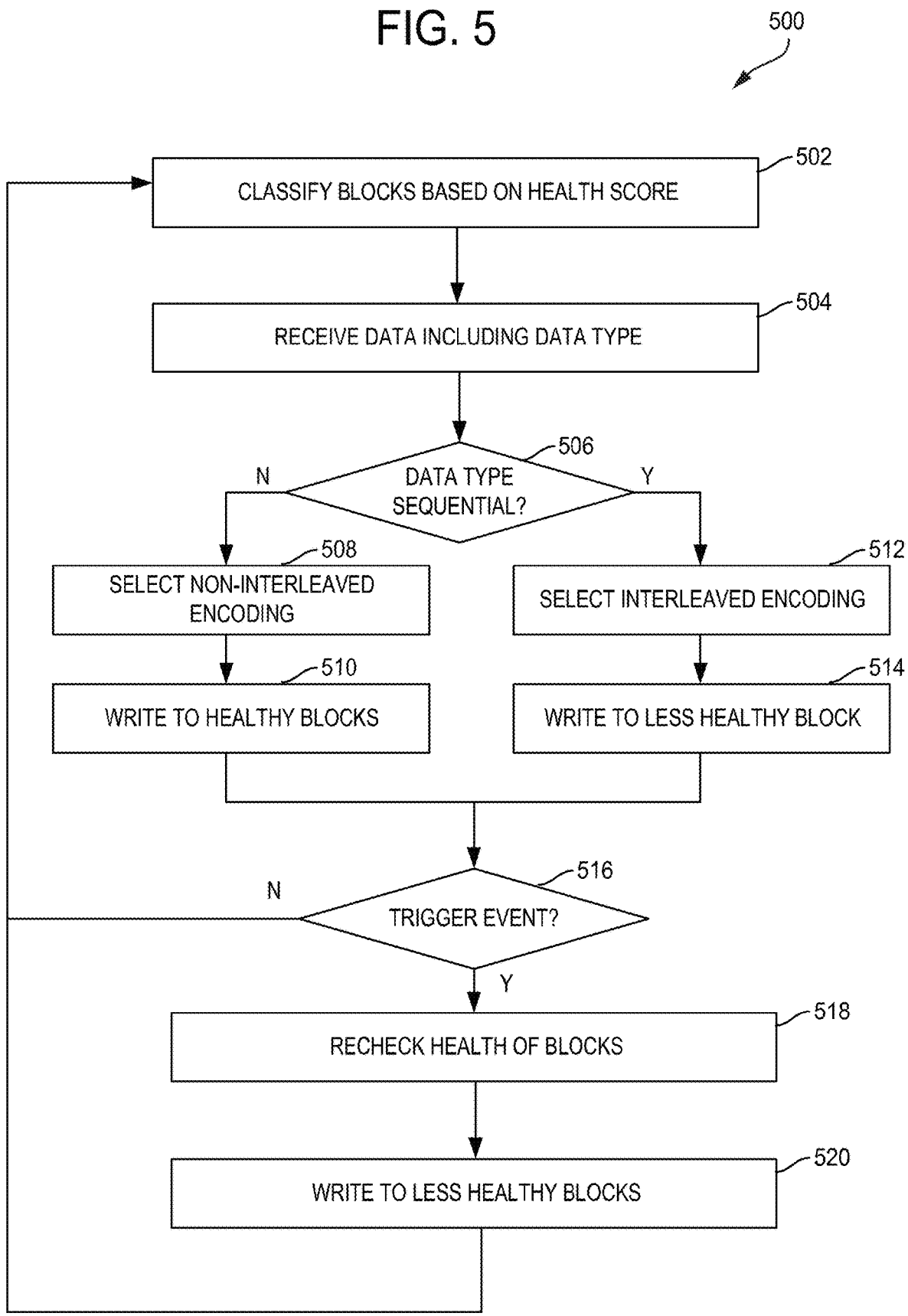
FIG. 5 is a flow chart of a process for coding based on block reliability, in accordance with some embodiments of the present disclosure.

Utilizing the storage device 104 of FIG. 1, which includes at least two partitions 114 in its long-term storage 112, FIG. 5 is a flow chart illustrating an embodiment of a process 500 for coding based on block reliability. Additional, fewer, or different operations may be performed in the process 500 depending on the embodiment. The process 500 may be implemented with the processor 118 of the controller 116 in an apparatus (e.g., the storage device 104 or the controller 116) based on firmware or other instructions stored in the controller instruction database 120, which may be in controller volatile memory (e.g., within the processor 118 in FIG. 1) or in the non-volatile memory 108. The instruction database 120 may include ECC protection level instructions, ECC algorithms, ECC code words of different lengths, and other attributes.

Referring to FIG. 5, a controller, such as the controller 116, classifies each block of a plurality of blocks of a memory array based on health (e.g., health scores) (502). In some embodiments, the controller ranks the blocks according to health. In some embodiments, the controller determines a health score for each block. In some embodiments, the controller assigns, links, or otherwise associates each block to a partition based on the corresponding health score. For example, the controller assigns a first block to a first partition, such as the partition 114A, associated with a random data type when the health score of the first block satisfies (e.g., is higher than) a first predetermined threshold (e.g., the health score falling within a first health score range). In another example, the controller assigns a second block to a second partition, such as the partition 114N, associated with a sequential data type when the health score of the second block satisfies (e.g., is lower than) a second predetermined threshold (e.g., the health score falling within a second health score range lower than the first health score range). The controller can access a data structure that maps health scores to partitions (e.g., partition IDs) to determine the predetermined thresholds (e.g., the health score ranges).

The controller receives, from a host, such as the host 101, data including data type (504). The data type may include random data, sequential data, or specific types of random or sequential data. In some embodiments, the parity portion of the data includes an indication of the data type. The controller determines whether the data type is sequential (506). If the controller determines that the data type is random, the controller selects non-interleaved encoding (508), and writes the data to the healthy blocks using the non-interleaved encoding (510). In some embodiments, the controller writes the data to the healthy blocks if non-interleaved encoding was selected. If the controller determines that the data type is sequential, the controller selects interleaved encoding (512), and writes the data to the less healthy (e.g., unhealthy) blocks using the interleaved encoding (514). In some embodiments, the controller writes the data to the less healthy blocks if interleaved encoding was selected. In some embodiments, a healthy block has a health score above a predetermined value and an unhealthy score has a health score below the predetermined value.

The controller determines whether there is a trigger event (516). The trigger event may be a change in the algorithm, a detection of an error rate or a program/erase cycle above a predetermined threshold in one or more partitions, garbage collection, wear leveling, or other memory management operations. In some embodiments, once every predetermined number of P/E cycles of the device or partition, the controller updates the classification of the plurality of blocks. If the controller determines that there is no trigger event (e.g., after a predetermined time interval), the process 500 starts over or, in some embodiments, the controller waits to receive new data. If the controller determines that there is a trigger event, the controller rechecks the health of the blocks (518). In some embodiments, the controller updates the health scores of the blocks. The controller writes data to less healthy blocks (520). In some embodiments, the predetermined threshold for determining the health of the blocks is adjusted (e.g., downwards). In some embodiments, the controller writes data previously stored in the healthy blocks to the less healthy blocks and deletes the corresponding data previously stored in the healthy blocks. In some embodiments, the controller only writes data that has been in the healthy blocks for at least a predetermined time period to the less healthy blocks. If the controller finishes writing data to less healthy blocks, the process 500 starts over or, in some embodiments, the controller waits to receive new data.

In the example of FIG. 5, the controller 116 stores random access data in the first partition with a first level of ECC protection, and the controller 116 stores sequential data or other non-random access data in the second partition using a second level of ECC protection. In some embodiments, the first level of ECC protection is a lower level of ECC protection than the second level of ECC protection. For example, the first level may include a non-interleaved ECC scheme such as illustrated in FIG. 4 and the second level of ECC protection may include an interleaved ECC scheme such as illustrated in FIG. 3. In other words, data programmed on blocks mapped, linked, associated, or otherwise corresponding to a first level partition may be programmed in a non-interleaved manner such as shown in FIG. 4, and data programmed on blocks mapped, linked, associated, or otherwise corresponding to a second level partition may be programmed in an interleaved manner such as shown in FIG. 3.

In some embodiments, the different levels (e.g., first and second levels) of ECC protection are part of a unified ECC protection level (e.g., have one or more same features). For example, data can be programmed to blocks of the first and second partitions using the same ECC algorithm, decoding method, code rate, code length, error floor, resolution of the cells (e.g., number of bits per cell), or a combination thereof. Herein, a code rate is the ratio between the amount of information bits (e.g. the data portion) and the total amount of bits (information plus parity). Herein, an error floor (e.g., region) is a region in which correction capability (e.g., BLER) almost flattens. The ECC algorithm (e.g., encoding method) may include a Bose-Chaudhuri-Hocquenghem (BCH) code, a low-density parity-check (LDPC) code, a turbo code, a Reed-Solomon (RS) code, a convolution code, or other codes. The decoding method may include Full Power decoding or Low Power decoding.

In a presently preferred embodiment, both the interleaving scheme and the ECC algorithm differ between the first partition and the second partition. For example, memory blocks are classified based on their health (e.g., healthy blocks are blocks having a health score above a predetermined value and less or unhealthy blocks are blocks having a health score below the predetermined value, but perhaps above a predetermined minimum health value). Then sequential type data is written to less healthy blocks but using an interleaved coding scheme, while non-sequential type data is written to healthy blocks but using a non-interleaved coding scheme. In other embodiments, the same interleaving scheme, but different ECC algorithms may be used in the first and second partitions, or the same ECC algorithm, but different code word lengths may be used. In yet another embodiment, the number of parity bits differs between the first and second partition with or without combining it with different information length or interleaved/non-interleaved schemes. In other embodiments, the levels of ECC protection may differ between partitions based on differing error floors.

The differences between the two or more partitions 114 in the long term storage 112 may include differences in one or more of the following: storing the data in interleaved or non-interleaved form, the number of redundancy bits used by the ECC, the length of the code words, the ECC algorithm, the error floor of the code, the decoding method. In some embodiments, the number of bits per cell may also vary from one partition to another. In one embodiment, a partition configured for random access data (or frequently accessed data) may include a shorter code word, a higher code rate and use a non-interleaved code word storage format. A partition configured for sequential (or less frequently accessed) data may then include a longer code word and lower code rate than the random partition, as well as use an interleaved code word storage format. In some embodiments utilizing more than two partitions, each partition may be configured with a different level of ECC protection.

By choosing a coding scheme based on the physical block health, some embodiments of the disclosure provide higher correction capability with a same ECC parity allocation as conventional systems and methods. Some embodiments of the disclosure provide real time physical block health by dynamically updating the blocks coding schemes according to the changing block health along device life time. Advantageously, some embodiments of the disclosure achieve a better wear leveling of physical blocks and enhance longevity of long-term storage.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

Although the figures show a specific order of method steps, the order of the steps may differ from what is depicted.

Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

The invention claimed is:

1. An apparatus, comprising:
a memory array; and
a processor in communication with the memory array, wherein the processor is configured to:
determine health scores for a plurality of blocks of the memory array, the health scores indicating the health of the blocks;
receive, from a host, data having a data type;
select an interleaving scheme for encoding the data based on the data type, wherein the interleaving scheme is one of interleaved and non-interleaved; and
write the data to a healthy block if a non-interleaved scheme was selected and write the data to an unhealthy block if an interleaved scheme was selected.

2. The apparatus of claim 1, wherein a healthy block has a health score above a predetermined value and an unhealthy block has a health score below the predetermined value.

3. The apparatus of claim 1, wherein the data type is one of sequential and non-sequential.

4. The apparatus of claim 3, wherein sequential data is written to an unhealthy block and non-sequential data is written to a healthy block.

5. The apparatus of claim 4, wherein a first Error Correction Code (ECC) scheme is used for sequential data and a second ECC scheme is used for non-sequential data.

6. The apparatus of claim 1, wherein the health score is based on a fail bit count of a first block.

7. The apparatus of claim 1, wherein the processor is further configured to assign the healthy block to a first partition based on a mapping of the health score of the healthy block and a partition identifier corresponding to the first partition.

8. The apparatus of claim 1, wherein the processor is further configured to:
assign the healthy block to a first partition associated with a random data type responsive to the health score of the healthy block satisfying a first predetermined threshold; and
assign the unhealthy block to a second partition associated with a sequential data type responsive to the health score of the unhealthy block satisfying a second predetermined threshold.

9. The apparatus of claim 8, wherein the first partition and the second partition are associated with a same code word length.

10. The apparatus of claim 1, wherein the processor is further configured to update the health score responsive to a schedule or a triggering event.

11. The apparatus of claim 1, wherein a parity portion of the data includes an indication of the data type.

12. The apparatus of claim 1, wherein the processor is further configured to:
identify the data type;
apply non-interleaved coding when the data type is a random type; and
apply interleaved coding when the data type is a sequential type.

13. A method comprising:
determining, by a controller, health scores for a plurality of blocks of a memory array, the health scores indicating the health of the blocks;
receiving, by the controller and from a host, data having a data type;
selecting, by the controller, an interleaving scheme for encoding the data based on the data type, wherein the interleaving scheme is one of interleaved and non-interleaved; and
writing, by the controller, the data to a healthy block if a non-interleaved scheme was selected and writing the data to an unhealthy block if an interleaved scheme was selected.

14. The method of claim 13, wherein the health score is based on a fail bit count of a first block.

15. The method of claim 13, further comprising assigning, by the controller, the healthy block to a first partition based on a mapping of the health score of the healthy block and a partition identifier corresponding to the first partition.

16. The method of claim 13, further comprising:
assigning, by the controller, the healthy block to a first partition associated with a random data type responsive to the health score of the healthy block satisfying a first predetermined threshold; and
assigning, by the controller, the unhealthy block to a second partition associated with a sequential data type responsive to the health score of the unhealthy block satisfying a second predetermined threshold.

17. The method of claim 16, wherein the first partition and the second partition are associated with a same code word length.

18. The method of claim 13, further comprising updating, by the controller, the health score responsive to a schedule or a triggering event.

19. The method of claim 13, wherein a parity portion of the data includes an indication of the data type.

20. The method of claim 13, further comprising:
applying, by the controller, non-interleaved coding when the data type is a random type; and
applying, by the controller, interleaved coding when the data type is a sequential type.

21. An apparatus, comprising:
a memory array; and
processing means in communication with the memory array, wherein the processing means includes:
means for determining health scores for a plurality of blocks of the memory array, the health scores indicating the health of the blocks;
means for receiving, from a host, data having a data type;
means for selecting an interleaving scheme for encoding the data based on the data type, wherein the interleaving scheme is one of interleaved and non-interleaved; and
means for writing the data to a healthy block if a non-interleaved scheme was selected and means for writing the data to an unhealthy block if an interleaved scheme was selected.

* * * * *